United States Patent [19]

Nagaishi

[11] Patent Number: 5,560,836
[45] Date of Patent: Oct. 1, 1996

[54] METHOD FOR FORMING A STEP ON A DEPOSITION SURFACE OF A SUBSTRATE FOR A SUPERCONDUCTING DEVICE UTILIZING AN OXIDE SUPERCONDUCTOR

[75] Inventor: Tatsuoki Nagaishi, Hyogo, Japan

[73] Assignee: Sumitomo Electric Industries, Ltd., Osaka, Japan

[21] Appl. No.: 338,094

[22] Filed: Nov. 9, 1994

[30] Foreign Application Priority Data

Dec. 27, 1993 [JP] Japan .................................. 5-348838

[51] Int. Cl.⁶ ...................................... B44C 1/22
[52] U.S. Cl. ................... 216/3; 216/38; 216/41; 216/66; 216/67; 505/329; 505/410
[58] Field of Search ..................... 216/3, 38, 41, 216/66, 67; 437/910; 505/329, 410, 411, 922

[56] References Cited

U.S. PATENT DOCUMENTS 5,077,266  12/1991  Takagi et al. ........................... 437/910
5,439,875  8/1995   Tanaka et al. ........................... 216/3

OTHER PUBLICATIONS

Surface Science Letters, 278 (1992) L153–L158.
Thin Solid Films, 232 (1993) 232–236.
Applied Physics Letter, vol. 57, No. 1, Jul. 2, 1990, pp. 90–92.
Applied Physics Letter, vol. 59, No. 6, Aug. 5, 1991, pp. 739–741.
Applied Physics Letter, vol. 58, No. 3, Jan. 21, 1991, pp. 301–303.
Journal of Applied Physics, vol. 73, No. 11, Jun. 1, 1993, pp. 7543–7548.
Applied Physics Letter, vol. 59, No. 20, Nov. 11, 1991, pp. 2606–2608.

*Primary Examiner*—William Powell
*Attorney, Agent, or Firm*—Kerkam, Stowell, Kondracki & Clarke, P.C.; John C. Kerins

[57] ABSTRACT

The present invention relates to a method or forming a step on a deposition surface of a substrate for depositing it thin film on it. The method comprises steps of etching a portion of the deposition surface of the substrate and conducting heat treatment of the substrate so as to recover crystallinity of the etched surface. The method can comprise steps of etching a portion of the deposition surface of the substrate and further etching the etched portion of the deposition surface of the substrate slightly so as to remove a degraded surface.

33 Claims, 4 Drawing Sheets

METHOD FOR FORMING A STEP ON A DEPOSITION SURFACE OF A SUBSTRATE FOR A SUPERCONDUCTING DEVICE UTILIZING AN OXIDE SUPERCONDUCTOR

BACKGROUND OF THE INVENTION

1. Field of the Invention

The present invention relates to a method for forming a step on a deposition surface of a substrate for a superconducting device utilizing an oxide superconductor, and more specifically to method for forming a step on a deposition surface of a substrate for a superconducting device such as a step type Josephson junction device of an oxide superconductor.

2. Description of Related Art

A Josephson junction device which is one of the most famous superconducting devices can be realized in various structures, for example, a stacked type (tunnel type) junction realized by a thin non-superconductor layer sandwiched between a pair of superconductors, a point contact type junction, a micro bridge type junction and a variable thickness bridge type junction which are composed of a pair of superconductor regions which are weakly linked to each other.

These Josephson junctions have fine structures so that fine processings are required to realize Josephson junction devices.

In order to realize a stacked type junction by using an oxide superconductor, a first oxide superconductor thin film, a non-superconductor thin film and a second oxide superconductor thin film are stacked on a substrate in the named order.

The thickness of the non-superconductor layer of the stacked type junction is determined by the coherence length of the superconductor. In general, the thickness of the non-superconductor layer of the stacked type junction must be within a few times of the coherence length of the superconductor. Since oxide superconductor materials have a very short coherence length, therefore, a thickness of a non-superconductor layer must be about a few nanometers.

However, the superconductor layers and the non-superconductor layer of the stacked type junction must be of high crystallinity for favorable junction properties, which are composed of single crystals or composed of polycrystals which are orientated in almost same direction. It is difficult to stack an extremely thin and high crystalline non-superconductor layer on an oxide superconductor layer. Additionally, it is very difficult to stack a high crystalline oxide superconductor layer on the non-superconductor layer stacked on an oxide superconductor layer. Though the stacked structure including a first oxide superconductor layer, a non-superconductor layer and a second oxide superconductor layer is realized, the interfaces between the oxide superconductor layers and the non-superconductor layer are not in good condition so that the stacked type junction does not function in good order.

In order to manufacture a point contact type junction, a micro bridge type junction and a variable thickness bridge type junction by using oxide superconductor, very fine processings which realize a weak link of a pair of the superconductors are necessary. It is very difficult to conduct a fine processing with good repeatability.

The point contact type junction has been formed of two oxide superconductor thin films which are in contact with each other in a extremely small area which constitutes the weak link of the Josephson junction.

The micro bridge type junction has been formed of a constant thickness oxide superconductor thin film which is formed on a substrate and which is patterned in a plan view, so that a superconductor thin film region having a greatly narrow width is formed between a pair of superconductor thin film regions having a sufficient width. In other words, the pair of superconductor thin film regions having a sufficient width are coupled to each other by the superconductor thin film region having the greatly narrow width. Namely, a weak link of the Josephson junction in the superconductor thin film is formed at the greatly narrow width region.

On the other hand, the variable thickness bridge type junction has been formed of an oxide superconductor thin film of a sufficient thickness which is formed on a substrate and which is partially etched or thinned in a thickness direction, so that a thinned oxide superconductor thin film portion is formed between a pair of superconductor thin film portions having the sufficient thickness. In other words, the pair of superconductor thin film portions having the sufficient thickness are coupled to each other by the thinned oxide superconductor thin film portion. Accordingly, a weak link of the Josephson junction is formed at the reduced thickness portion of the oxide superconductor thin film.

As would be understood from the above, a characteristics of the Josephson junction device has a close relation to the contact area of the superconductor thin film in the point contact type Josephson device, the width of the superconductor thin film region having the extremely narrow width in the micro bridge type Josephson device, and to the thickness of the thinned oxide superconductor thin film portion in the variable thickness bridge type Josephson device, both of which form the weak link of the Josephson junction. Therefore, in order to obtain a desired characteristics with a good repeatability, a high precision on a sub-micron level of the processing such as the etching is required.

The micro bridge type Josephson device can be said to be more preferable than the variable thickness bridge type Josephson device, since the micro bridge type Josephson device has a relatively planer surface, which is preferred in a integrated circuit. However, in order to form the weak link in the micro bridge type Josephson device, it is required to pattern an oxide superconductor thin film having the thickness on the order of 0.5 μm to 1.0 μm into a width of not greater than 0.2 μm. However, it is very difficult to conduct this fine patterning with good repeatability.

On the other hand, in the variable thickness bridge type Josephson device, the very fine pattering is not required in order to form the weak link. However, it is very difficult to uniformly control the remaining thickness of the thinned portion forming the weak link. In addition, the variable thickness bridge type Josephson device cannot have a planer surface by nature. This is not preferable to the integrated circuit application.

In order to resolve the above mentioned problems, researches have been conducted to manufacture a Josephson junction device taking account of the characteristics advantage intrinsic to the oxide superconductor, which permits it to avoid the fine processing of the oxide superconductor.

The superconducting characteristics of the oxide superconductor considerably varies, depending on the crystalline direction. Particularly, the oxide superconductor has a large critical current density in the direction perpendicular to the c-axes of its crystals. Thus, if the oxide superconductors having crystalline directions different from each other are joined together, a grain boundary at the interface becomes a barrier of the weak link so that a Josephson junction is formed. A Josephson junction device utilizing this Josephson junction is called artificial grain boundary type Josephson junction device. A Josephson junction device of this type can be manufactured without the fine processing as mentioned above.

In order to manufacture the artificial grain boundary type Josephson junction device, in a prior art, an oxide superconductor thin film is deposited on a substrate having a step in its deposition surface. The deposited oxide superconductor thin film has a different crystal orientation at the step portion so that two grain boundaries are formed at the top and the bottom of the step portion. If the step has a proper height, the two grain boundaries function as a weak link of a Josephson junction. A Josephson junction device utilizing this Josephson junction is called a step type Josephson junction device.

The preferable height of the step is considered to range from 100 to 500 nanometers and is determined by a thickness of the oxide superconductor thin film.

In a prior art, the step of the substrate is generally formed by a physical etching process such as ion milling using Ar ions, reactive ion etching, sputtering etching, etc. However, the deposition surface of the substrate is often degraded in its crystallinity by the physical etching process so that an oxide superconductor thin film having high quality can not be deposited on it.

SUMMARY OF THE INVENTION

Accordingly, it is an object of the present invention to provide a method for forming a step on a deposition surface of a substrate for a superconducting device utilizing an oxide superconductor, which have overcome the above mentioned defects of the conventional ones.

Another object of the present invention is to provide a method for manufacturing a Josephson junction device with good repeatability by using already established processing techniques.

The above and other objects of the present invention are achieved in accordance with the present invention by a method for forming a step on a deposition surface of a substrate for depositing a thin film on it comprising steps of etching a portion of the deposition surface of the substrate and conducting heat treatment of the substrate so as to recover crystallinity of the etched surface.

In a preferred embodiment, the heat treatment is conducted under oxygen atmosphere. In another preferred embodiment, the heat treatment is conducted under high vacuum. It is determined by a material of the substrate whether the heat treatment is conducted under oxygen atmosphere or under high vacuum.

According to another aspect of the present invention, there is provided a method for forming a step on a deposition surface of a substrate for depositing a thin film on it comprising steps of etching a portion of the deposition surface of the substrate and further etching the etched portion of the deposition surface of the substrate slightly so as to remove a degraded surface. The etched portion of the deposition surface of the substrate is preferably etched to a depth of 5 nanometers by the second etching.

In a preferred embodiment, the second etching is conducted by low acceleration voltage ion milling using Ar ions, for example 70 to 80 volts.

In another preferred embodiment, the second etching is conducted by chemical etching. In this case, the chemical etching is conducted by using an etchant selected from the group consisting of sulfuric acid, hydrofluoric acid, phosphoric acid, solution of sodium hydroxide and mixture of nitric acid and hydrofluoric acid.

In a preferred embodiment, the oxide superconductor is formed of high-$T_c$ (high critical temperature) oxide superconductor, particularly, formed of a high-$T_c$ copper-oxide type compound oxide superconductor for example a Y—Ba—Cu—O compound oxide superconductor material, a Bi—Sr—Ca—Cu—O compound oxide superconductor material, and a Tl—Ba—Ca—Cu—O compound oxide superconductor material.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Step type Josephson junction devices were manufactured by using MgO single crystalline substrates, YSZ (yttrium stabilized zirconia) substrates, $SrTiO_3$ single crystalline substrates, $NdGaO_3$ single crystalline substrates and $LaAlO_3$ single crystalline substrate having steps formed by the method in accordance with the present invention. Referring FIGS. 1A to 1E, the process for manufacturing the step type junction devices will be described.

Figure 1A:
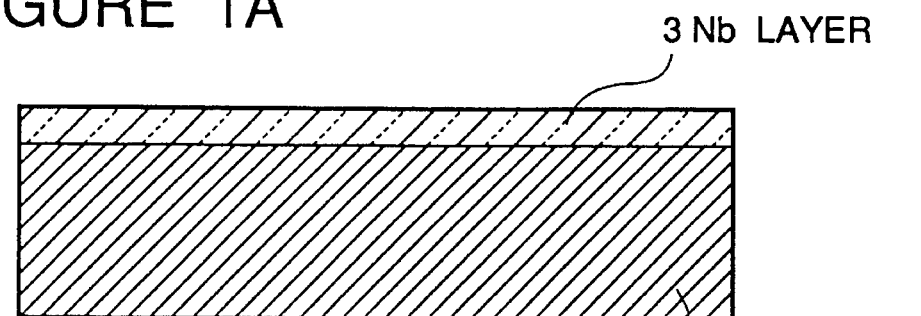
FIGS. 1A to 1E are diagrammatic sectional views illustrating process for manufacturing a step type Josephson unction device utilizing a substrate having a step formed by the method in accordance with the present invention.

As shown in FIG. 1A, a Nb layer 3 having a thickness of 100 nanometers was deposited on a substrate 2 by sputtering. The Nb layer can be also deposited by vacuum evaporation.

Figure 1B:
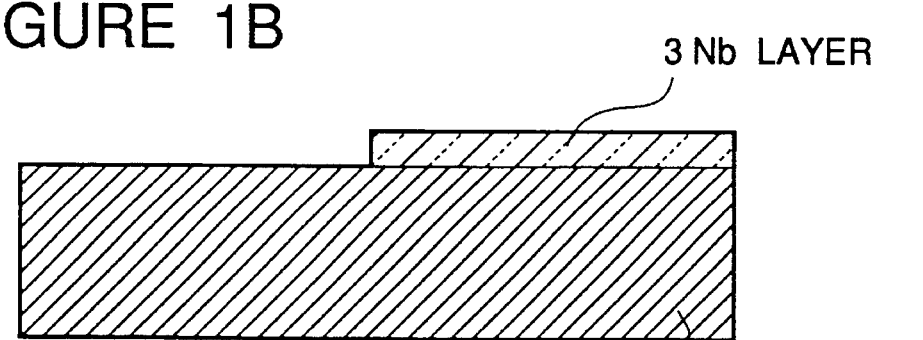

Then, a left half of the Nb layer 3 was removed by photolithography process utilizing $CF_4$ plasma so as to expose the substrate 2, as shown in FIG. 1B.

Figure 1C:
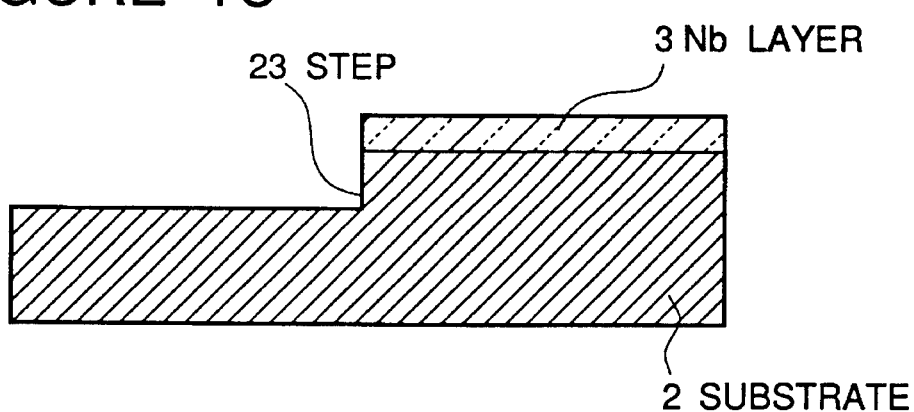

The exposed portion of the substrate 2 was etched by ion milling using Ar ions so as to form a step 23 having a height of 200 nanometers, as shown in FIG. 1C. The ion milling was conducted under the following condition:

| | |
|---|---|
| Acceleration voltage | 600 V |
| Current | 200 mA |
| Pressure | $1 \times 10^{-4}$ Torr |
| Duration | 15 minutes |

Figure 1D:
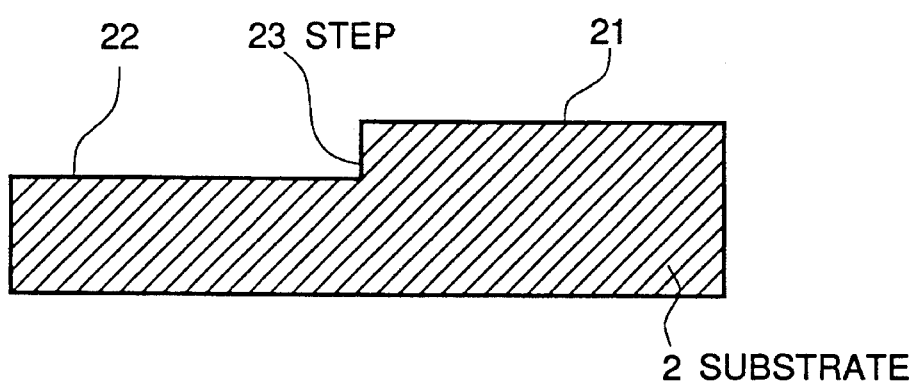

After the etching, the Nb layer 3 was completely removed by utilizing $CF_4$ plasma so as to expose non-etched surface 21 of the substrate 2, as shown in FIG. 1D.

Then, the substrate 2 was heat-treated under high vacuum or under oxygen atmosphere so as to recover crystallinity of the etched surface 22 of the substrate 2. The conditions of the heat treatment for each material are as follows:

| Material of Substrate | Atmosphere | Pressure | Heat Temperature | Duration |
|---|---|---|---|---|
| MgO | Oxygen | 1 atm | 1150° C. | 2 hr.≦ |
| YSZ | Oxygen | 0.3 atm | 1200° C. | 3 hr.≦ |
| SrTiO$_3$ | High Vacuum | 10$^{-6}$ Torr | 1150° C. | 5 min.≦ |
| NdGaO$_3$ | High Vacuum | 10$^{-6}$ Torr | 1100° C. | 7 min.≦ |
| LaAlO$_3$ | High Vacuum | 10$^{-6}$ Torr | 1050° C. | 5 min.≦ |

In the heat treatment, a MgO substrate is preferably heated to a temperature ranging from 1100° to 1200 ° C. for 2 to 3 hours;

a YSZ substrate is preferably heated to a temperature ranging from 1150° to 1250 ° C. for 3 to 4 hours;

a SrTiO$_3$ substrate is preferably heated to a temperature ranging from 1050° to 1250 ° C. for 5 to 10 minutes;

a NdGaO$_3$ substrate is preferably heated to a temperature ranging from 1050° to 1150 ° C. for 7 to 10 minutes; and a LaAlO$_3$ substrate is preferably heated to a temperature ranging from 1000° to 1150 ° C. for 5 to 7 minutes.

Figure 2A:
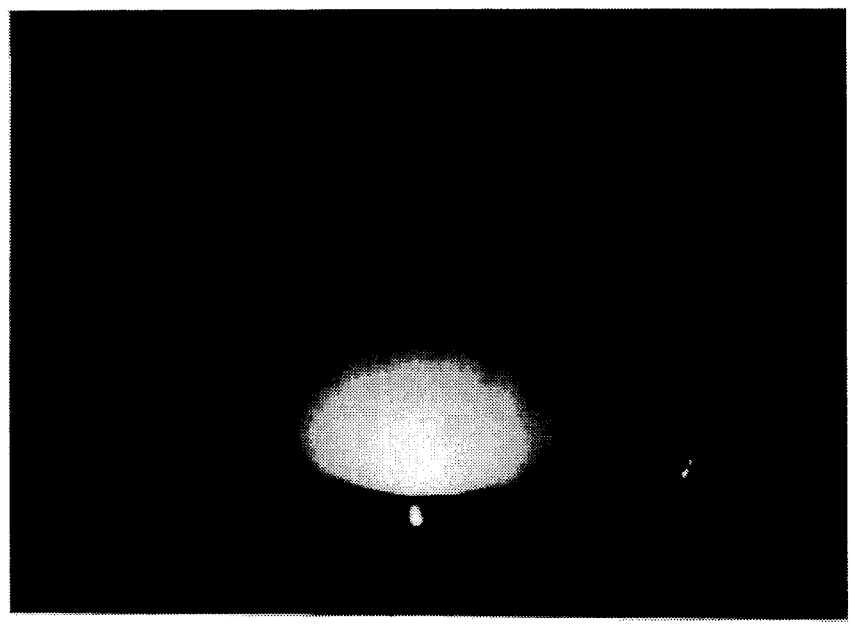
FIGS. 2A and 2B are RHEED (Refractive High Energy Electron Diffraction) images of an etched portion of a $SrTiO_3$ substrate just after etching by ion milling using Ar ions and after heat-treatment.

Surface crystallinity of the etched substrates was evaluated by RHEED before and after the above heat treatment. FIG. 2A is a RHEED image of an etched portion of a SrTiO$_3$ substrate before the heat treatment. This RHEED image is a halo pattern which showed that crystallinity of the etched portion of the SrTiO$_3$ substrate was lost to a depth of on the order of 5 nanometers.

Figure 2B:
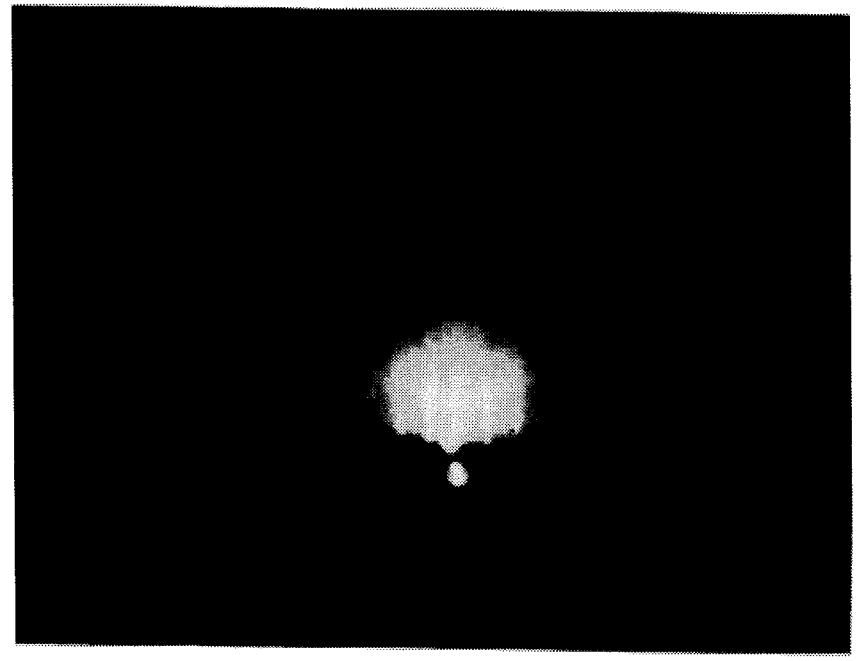
Figure 3A:
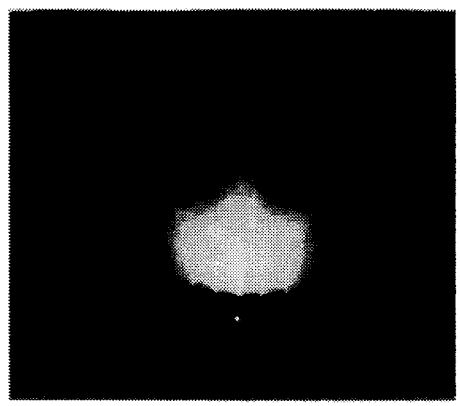
FIGS. 3A to 3D are RHEED images of $SrTiO_3$ substrates after etching by hydrofluoric acid, mixture of nitric acid and hydrofluoric acid, concentrated phosphoric acid, and concentrated solution of sodium hydroxide.
Figure 3B:
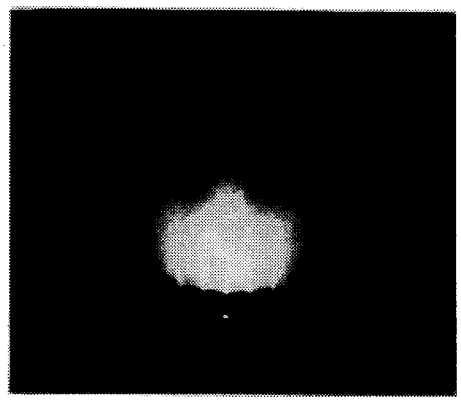
Figure 3C:
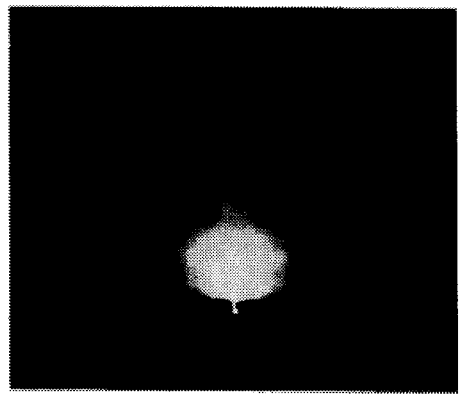
Figure 3D:
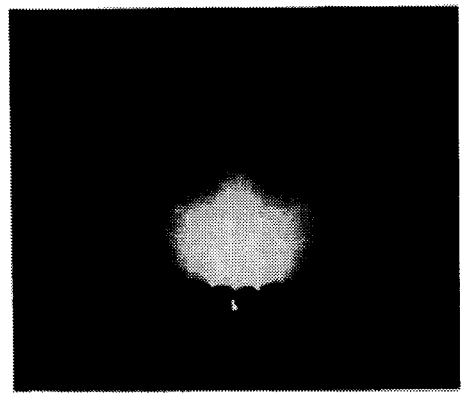

On the other hand, FIG. 2B is a RHEED image of the etched portion of the SrTiO$_3$ substrate after the heat treatment. A streak pattern can be observed in FIG. 2B, which showed that crystallinity was recovered at the etched portion and it had a good surface condition.

Similar results could be obtained for a MgO substrate, a YSZ substrate and NdGaO$_3$ substrate so that it was clearly ascertained that the heat treatment was effective to recover crystallinity of surfaces of the etched portions of the substrate.

Figure 1E:
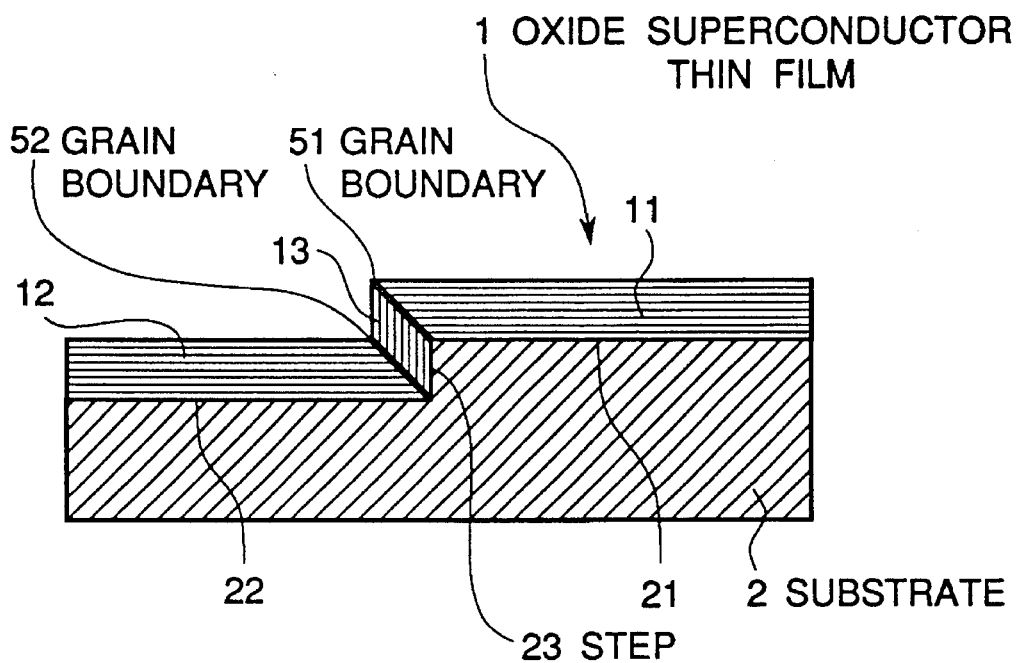

Thereafter, as shown in FIG. 1E, a $Y_1Ba_2Cu_3O_{7-x}$ oxide superconductor thin film 1 having a thickness of 200 nanometers was deposited on the substrate 2 by laser ablation. The conditions of the laser ablation process were as follows;

| Target | $Y_1Ba_2Cu_3O_{7-x}$ pellet (sintered) |
|---|---|
| Temperature of substrate | 700° C. |
| Atmosphere | O$_2$ |
| Pressure | 400 mTorr |
| Laser energy | 0.4 Joule/pulse |
| Density of laser energy | 2.0 Joule/cm$^2$ |
| Laser pulse rate | 5 Hz |

The $Y_1Ba_2Cu_3O_{7-x}$ oxide superconductor thin film 1 had two regions 11 and 12 formed of c-axis orientated $Y_1Ba_2Cu_3O_{7-x}$ oxide superconductor single crystals on the non-etched surface 21 and etched surface 22 of the substrate 2, which were connected by a portion 13 having a different crystal orientation positioned at the step 23. Grain boundaries 51 and 52 were created at the interfaces between the portions and 13 and between the portions 12 and 13. The portions 11 and 12 of the $Y_1Ba_2Cu_3O_{7-x}$ oxide superconductor thin film 1 were linked weakly by the grain boundaries 51 and 52 and the portion 13 so that the Josephson junction was formed.

Figure 1F:
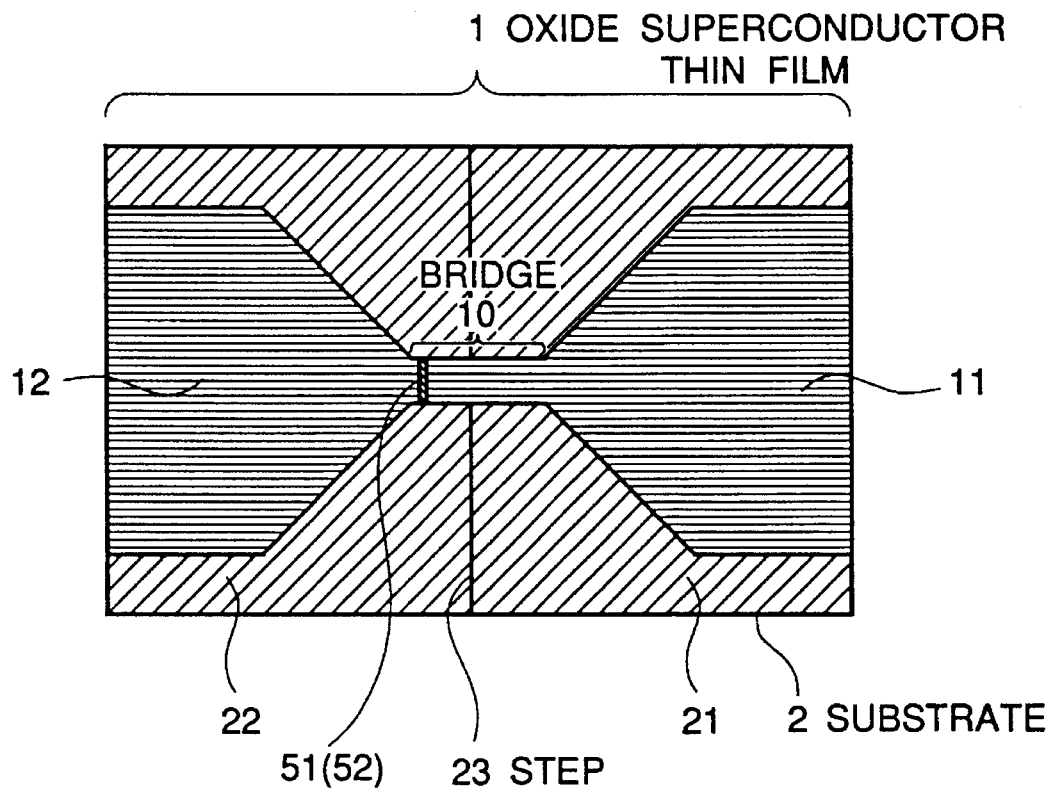
FIG. 1F is a diagrammatic plane view of the step type Josephson junction device.

Finally, the $Y_1Ba_2Cu_3O_{7-x}$ oxide superconductor thin film 1 was patterned by a photolithography process so as to form a bridge portion 10 having a width of 5 μm and length of 10 μm between portions 11 and 12, as shown in FIG. 1F. With this, the step type Josephson junction device was completed.

Characteristics of the above mentioned step type Josephson junction device was evaluated by four terminal method, so that RSJ (Resistively Shunted Junction) type characteristics of a Josephson junction can be obtained at the liquid nitrogen temperature of 77.3 K. When a microwave was irradiated, clear Shapiro steps corresponding to a frequency of the microwave were observed, and therefore, it could be ascertained that a good Josephson junction was realized.

More than one hundred step type Josephson junction devices were manufactured for each of the MgO single crystalline substrate, YSZ substrate, SrTiO$_3$ single crystalline substrate, NdGaO$_3$ single crystalline substrate and LaAlO$_3$ single crystalline substrate by the above mentioned process and a conventional process without the heat treatment. More than 90 percent of the step type Josephson junction devices manufactured by the above process functioned at 77.3 K. However, less than 1 percent of the step type Josephson junction devices manufactured by the conventional process functioned at 77.3 K.

Embodiment 2

A second embodiment of the process for manufacturing the step type Josephson junction device will be described. In this second embodiment, the same processings as those shown in FIGS. 1A to 1C were performed.

After the substrate 2 was etched by ion milling using Ar ions so as to form a step 23, the etched surface 22 of the substrate 2 was further etched to a depth of 5 nanometers by low acceleration voltage ion milling using Ar ions in order to remove a degraded surface. The conditions of the low acceleration voltage ion milling were as follows:

| Acceleration voltage | 70–80 V |
|---|---|
| Current | 150–250 mA |
| Pressure | $1 \times 10^{-4} - 3 \times 10^{-4}$ Torr |
| Duration | 30 minutes |

The above conditions were common to each of the MgO single crystalline substrate, YSZ substrate, SrTiO$_3$ single crystalline substrate, NdGaO$_3$ single crystalline substrate and LaAlO$_3$ single crystalline substrate.

If the acceleration voltage is lower than 70 volts, it takes too long time to etch the substrate to an enough depth. If the acceleration voltage is higher than 80 volts, the etched surface is again degraded.

Thereafter, the Nb layer 3 was completely removed by utilizing $CF_4$ plasma so as to expose non-etched surface 21 of the substrate 2. A $Y_1Ba_2Cu_3O_{7-x}$ oxide superconductor thin film 1 having a thickness of 200 nanometers was deposited on the substrate 2 by laser ablation under the same conditions as Embodiment 1. The $Y_1Ba_2Cu_3O_{7-x}$ oxide superconductor thin film 1 was patterned so as to form an equal Josephson junction device to that of Embodiment 1.

Characteristics of the above mentioned step type Josephson junction device was evaluated at the liquid nitrogen temperature, so that 70 to 75 percent of the step type Josephson junction devices manufactured for each of the MgO single crystalline substrate, YSZ substrate, $SrTiO_3$ single crystalline substrate, $NdGaO_3$ single crystalline substrate and $LaAlO_3$ single crystalline substrate by the above process functioned at the liquid nitrogen temperature.

Embodiment 3

A third embodiment of the process for manufacturing the step type Josephson junction device will be described. In this third embodiment, only MgO substrates were used and the same processings as those shown in FIGS. 1A to 1C were performed.

After the MgO substrate 2 was etched by ion milling using Ar ions so as to form a step 23 and the Nb layer 3 was completely removed by utilizing $CF_4$ plasma, the surface of the substrate 2 was further etched chemically to a depth of 5 nanometers by wet etching process. The chemical etching was conducted by respectively using sulfuric acid, mixture of nitric acid and hydrofluoric acid, and phosphoric acid. The conditions were shown as follows:

| Acid | Temperature | Duration |
| --- | --- | --- |
| Concentrated sulfuric acid | Room temperature | 2–5 min. |
| Mixture of nitric acid and hydrofluoric acid nitric acid:hydrofluoric acid: water 2:2:1 (by volume) | Room temperature | 10–20 sec. |
| Concentrated phosphoric acid | 100–150° C. | 10–20 sec. |

Surface crystallinity of the etched substrates was evaluated by RHEED before and after the above chemical etching. The RHEED images were halo patterns before the chemical etching and became streak patterns after the chemical etching, so that it became clear that crystallinity was recovered at the etched portions and they had a good surface condition.

If a duration of the chemical etching was shorter than the above range or a temperature of the acid was lower than the above range, the surface crystallinity was not recovered. On the her hand, if a duration of the chemical etching was longer than the e range or a temperature of the acid was higher than the above range, surface of the substrate became roughened.

After the chemical etching, a $Y_1Ba_2Cu_3O_{7-x}$ oxide superconductor thin film 1 having a thickness of 200 nanometers was deposited on the substrate 2 by laser ablation under the same conditions as Embodiment 1. The $Y_1Ba_2Cu_3O_{7-x}$ oxide superconductor thin 1 was patterned so as to form an equal Josephson junction device to that of Embodiment 1.

Characteristics of the above mentioned step type Josephson junction devices manufactured by the above process evaluated at the liquid nitrogen temperature. By this, it became clear 90 to 92 percent of the step type Josephson junction devices formed on substrates etched by the concentrated sulfuric acid functioned at the liquid nitrogen temperature. 89 to 92 percent of the step type Josephson junction devices formed on substrates etched by the mixture of nitric and hydrofluoric acid functioned at the liquid nitrogen temperature. 90 to 92 percent of the step type Josephson junction devices formed on substrates etched by the concentrated phosphoric acid functioned a the liquid nitrogen temperature.

Embodiment 4

A forth embodiment of the process for manufacturing the step type Josephson junction device will be described. In this forth embodiment, only YSZ substrates were used and the same processings as those shown in FIGS. 1A to 1C were performed.

After the YSZ substrate 2 was etched by ion milling using Ar ions so as to form a step 23 and the Nb layer 3 was completely removed by utilizing $CF_4$ plasma, the surface of the substrate 2 was further etched chemically to a depth of 5 nanometers by wet etching process. The chemical etching was conducted by respectively using hydrofluoric acid and mixture of nitric acid and hydrofluoric acid. The conditions were shown as follows:

| Acid | Temperature | Duration |
| --- | --- | --- |
| Hydrofluoric acid (20–50 percent aqueous solution) | Room temperature | 1–3 min. |
| Mixture of nitric acid and hydrofluoric acid nitric acid:hydrofluoric acid: water 4:3:1 (by volume) | Room temperature | 20–40 sec. |

Surface crystallinity of the etched substrates was evaluated by RHEED before and after the above chemical etching. The RHEED images were halo patterns before the chemical etching and became streak patterns after the chemical etching, so that it became clear that crystallinity was recovered at the etched portions and they had a good surface condition.

If a duration of the chemical etching was shorter than the above range or a temperature of the acid was lower than the above range, the surface crystallinity was not recovered. On the other hand, if a duration of the chemical etching was longer than the above range or a temperature of the acid was higher than the above range, the surface of the substrate became roughened.

After the chemical etching, a $Y_1Ba_2Cu_3O_{7-x}$ oxide superconductor thin film 1 having a thickness of 200 nanometers was deposited on the substrate 2 by laser ablation under the same conditions as Embodiment 1. The $Y_1Ba_2Cu_3O_{7-x}$ oxide superconductor thin film 1 was patterned so as to form an equal Josephson junction device to that of Embodiment 1.

Characteristics of the above mentioned Josephson junction device was evaluated at the liquid nitrogen temperature, so that 85 to 88 percent of the Josephson junction devices manufactured by the above process functioned at the liquid nitrogen temperature.

Embodiment 5

A fifth embodiment of the process for manufacturing the step type Josephson junction device will be described. In this fifth embodiment, only $SrTiO_3$ substrates were used and the same processings as those shown in FIGS. 1A to 1C were performed.

After the $SrTiO_3$ substrate 2 was etched by ion milling using Ar ions so as to form a step 23 and the Nb layer 3 as completely removed by utilizing $CF_4$ plasma, the surface of the substrate 2 was further etched chemically to a depth of 5 nanometers by wet etching process. The chemical etching was conducted by respectively using hydrofluoric acid, mixture of nitric acid and hydrofluoric acid, phosphoric acid and solution of sodium hydroxide. The conditions were shown as follows:

| Medium | Temperature | Duration |
| --- | --- | --- |
| Hydrofluoric acid (10–30 percent aqueous solution) | Room temperature | 5–10 min. |
| Mixture of nitric acid and hydrofluoric acid nitric acid:hydrofluoric acid: water 3:3:1 (by volume) | Room temperature | 30 sec.–2 min. |
| Concentrated phosphoric acid | 100–150° C. | 10–30 sec. |
| Concentrated solution of sodium hydroxide | 80–130° C. | 3–5 min. |

Surface crystallinity of the etched substrates was evaluated by RHEED before and after the above chemical etching. The RHEED images had been halo patterns before the chemical etching and became streak patterns after the chemical etching, so that it became clear that crystallinity was recovered at the etched portions is and they had a good surface condition. There are shown RHEED images of the substrates after the chemical etching in FIGS. 3A to 3D.

If a duration of the chemical etching was shorter than the above range or a temperature of the medium was lower than the above range, the surface crystallinity was not recovered. On the other hand, if a duration of the chemical etching was longer than the above range or a temperature of the medium was higher than the above range, the surface of the substrate became roughened.

After the chemical etching, a $Y_1Ba_2Cu_3O_{7-x}$ oxide superconductor thin film 1 having a thickness of 200 nanometers was deposited on the substrate 2 by laser ablation under the same conditions as Embodiment 1. The $Y_1Ba_2Cu_3O_{7-x}$ oxide superconductor thin film 1 was patterned so as to form an equal Josephson junction device to that of Embodiment 1.

Characteristics of the above mentioned Josephson junction device was evaluated at the liquid nitrogen temperature, so that 92 to 95 percent of the Josephson junction devices manufacture by the above process functioned at the liquid nitrogen temperature.

Embodiment 6

A sixth embodiment of the process for manufacturing the step type Josephson junction device will be described. In this sixth embodiment, only $NdGaO_3$ substrates were used and the same processings as those shown in FIGS. 1A to 1C were performed.

After the $NdGaO_3$ substrate 2 was etched by ion milling using Ar ions so as to form a step 23 and the Nb layer 3 was completely removed by utilizing $CF_4$ plasma, the surface of the substrate 2 was further etched chemically to a depth of 5 nanometers by wet etching process. The chemical etching was conducted by respectively using mixture of nitric acid and hydrofluoric acid, and solution of sodium hydroxide. The conditions were shown as follows:

| Medium | Temperature | Duration |
| --- | --- | --- |
| Mixture of nitric acid and hydrofluoric acid nitric acid:hydrofluoric acid: water 2:2:1 (by volume) | Room temperature | 10–20 sec. |
| Concentrated solution of sodium hydroxide | 80–130° C. | 3–5 min. |

Surface crystallinity of the etched substrates was evaluated by RHEED before and after the above chemical etching. The RHEED images were halo patterns before the chemical etching and became streak patterns after the chemical etching, so that it became clear that crystallinity was recovered at the etched portions and they had a good surface condition.

If a duration of the chemical etching was shorter than the above range or a temperature of the medium was lower than the above range, the surface crystallinity was not recovered. On the other hand, if a duration of the chemical etching was longer than the above range or a temperature of the medium was higher than the above range, the surface of the substrate became roughened.

After the chemical etching, a $Y_1Ba_2Cu_3O_{7-x}$ oxide superconductor thin film 1 having a thickness of 200 nanometers was deposited on the substrate 2 by laser ablation under the same conditions as Embodiment 1. The $Y_1Ba_2Cu_3O_{7-x}$ oxide superconductor thin film 1 was patterned so as to form an equal Josephson junction device to that of Embodiment 1.

Characteristics of the above mentioned step type Josephson junction device was evaluated at the liquid nitrogen temperature, so that 90 to 92 percent of the step type Josephson junction devices manufactured by the above process functioned at the liquid nitrogen temperature.

Embodiment 7

A seventh embodiment of the process manufacturing the step type Josephson junction device will be described. In this seventh embodiment, only $LaAlO_3$ substrates were used and the same processings as those shown in FIGS. 1A to 1C were performed.

After the $LaAlO_3$ substrate 2 was etched ion milling using Ar ions so as to form a step 23 and the Nb layer 3 completely removed by utilizing $CF_4$ plasma, the surface of the substrate 2 was further etched chemically to a depth of 5 nanometers by wet etching process. The chemical etching was conducted by respectively using mixture of nitric acid and hydrofluoric acid, phosphoric acid and solution of sodium hydroxide. The conditions were shown as follows:

| Medium | Temperature | Duration |
| --- | --- | --- |
| Mixture of nitric acid and hydrofluoric acid nitric acid:hydrofluoric acid: water 2:2:1 (by volume) | Room temperature | 1–3 sec. |
| Concentrated phosphoric acid | 70–110° C. | 10–30 sec. |
| Concentrated solution of sodium hydroxide | 50–110° C. | 1–3 min. |

Surface crystallinity of the etched substrates was evaluated by RHEED before and after the above chemical etching. The RHEED images were halo patterns before the chemical etching and became streak patterns after the chemical etching, so that it became clear that crystallinity was recovered at the etched portions and they had a good surface condition.

If a duration of the chemical etching was shorter than the above range or a temperature of the medium was lower than the above range, the surface crystallinity was not recovered. On the other hand, if a duration of the chemical etching was longer than the above range or a temperature of the medium was higher than the above range, the surface of the substrate became roughened.

After the chemical etching, a $Y_1Ba_2Cu_3O_{7-x}$ oxide superconductor thin film 1 having a thickness of 200 nanometers was deposited on the substrate 2 by laser ablation under the same conditions as Embodiment 1. The $Y_1Ba_2Cu_3O_{7-x}$ oxide superconductor thin film 1 was patterned so as to form an equal Josephson junction device to that of Embodiment 1.

Characteristics of the above mentioned step type Josephson junction device was evaluated at the liquid nitrogen temperature, so that 90 to 92 percent of the step type Josephson junction devices manufactured by the above process functioned at the liquid nitrogen temperature.

As explained above, in accordance with the method of the present invention, it becomes possible to form a step on a substrate without degrading crystallinity of the surface of the substrate. In addition, a high quality oxide superconductor thin film can be deposited on the surface of the substrate processed in accordance with the method of the present invention, so that superconducting devices such as step type Josephson junction devices can be easily manufactured.

In the above mentioned embodiments, the substrates were etched by ion milling using Ar ions in order to form a step. However, the present invention can be applied to any etching process, if the etched surface of the substrate is lost its crystallinity, for example reactive ion etching, sputtering etching, etc.

In addition, the oxide superconductor thin film can be formed of not only the Y—Ba—Cu—O compound oxide superconductor material, but also a high-$T_c$ (high critical temperature) oxide superconductor material, particularly a high-$T_c$ copper-oxide type compound oxide superconductor material, for example a Bi—Sr—Ca—Cu—O compound oxide superconductor material, and a Tl—Ba—Ca—Cu—O compound oxide superconductor material.

The invention has thus been shown and described with reference to the specific embodiments. However, it should be noted that the present invention is in no way limited to the details of the illustrated structures but converts and modifications may be made within the scope of the appended claims.

I claim:

1. A method for forming a step on a deposition surface of a substrate for depositing a thin film on it comprising steps of etching a portion of the deposition surface of the substrate and conducting heat treatment of the substrate so as to recover crystallinity of the etched surface.

2. A method as claimed in claim 1, wherein the heat treatment is conducted under oxygen atmosphere.

3. A method as in claim 1, comprising the further step of, subsequently to forming said step on said deposition surface of said substrate, forming an oxide superconductor thin film on said deposition surface of said and on said step formed thereon, thereby forming a type Josephson junction device.

4. A method as claimed in claim 1, wherein the heat treatment is conducted under high vacuum.

5. A method as claimed in claim 4, the heat treatment is conducted under a pressure equal to or lower than $10^{-6}$ Torr.

6. A method for forming a step on a deposition surface of a substrate for depositing a thin film on it comprising the steps of etching a portion of the deposition surface of the substrate and further etching the etched portion of the deposition surface of the substrate slightly by low acceleration voltage ion milling using Ar ions so as to a degraded surface.

7. A method as claimed in claim 6, wherein the acceleration voltage ranges from 70 to 80 volts.

8. A method for forming a step on a deposition surface of a substrate for depositing a thin film on it, comprising the steps of a portion of the deposition surface of the substrate and further etching the etched portion of the deposition surface of the substrate slightly by chemical etching so as to remove a degraded surface.

9. A method as claimed in claim 8, wherein the chemical etching is conducted by using an etchant selected from the group consisting of sulfuric acid, hydrofluoric acid, phosphoric acid, solution of sodium hydroxide and mixture of nitric acid and hydrofluoric acid.

10. A method as claimed in claim 8, wherein the substrate is YSZ substrate and the chemical etching is conducted by using an etchant selected from the group consisting of 20–50 aqueous solution of hydrofluoric acid and mixture of nitric acid hydrofluoric acid including 4 parts of nitric acid, 3 parts of hydrofluoric acid and 1 part of water by volume.

11. A method as claimed in claim 8, wherein substrate is $SrTiO_3$ substrate and the chemical etching is conducted by using an etchant selected from the group consisting of 10–30 percent aqueous solution of hydrofluoric acid, mixture of nitric acid and hydrofluoric acid including 3 parts of nitric acid, 3 parts of hydrofluoric acid 1 part of water by volume, concentrated phosphoric acid and concentrated solution of sodium hydroxide.

12. A method as claimed in claim 8, wherein substrate is $NdGaO_3$ substrate and the chemical etching is conducted by using an etchant selected from the group consisting of mixture of nitric acid and hydrofluoric acid including 2 parts of nitric acid 2 parts of hydrofluoric acid and 1 part of water by volume and concentrated solution of sodium hydroxide.

13. A method as claimed in claim 8, wherein substrate is $LaAlO_3$ substrate and the chemical etching is d by using an etchant selected from the group consisting of mixture of nitric acid and hydrofluoric acid including 3 parts of nitric acid, 3 parts of hydrofluoric acid and 1 part of water by volume, concentrated phosphoric acid and concentrated solution of sodium hydroxide.

14. A method as claim 6 the further step of, subsequently to forming said step on said deposition surface of said substrate, forming an oxide superconductor thin film on aid deposition surface of said substrate and on said step formed thereon, thereby forming a step type Josephson junction device.

15. A method as claimed in claim 9, wherein the chemical etching is conducted using sulfuric acid at room temperature.

16. A method as claimed in claim 15, wherein the substrate is a MgO single crystal substrate and the chemical etching is conducted using concentrated sulfuric acid.

17. A method as claimed in claim 9, wherein the chemical etching is conducted using hydrofluoric acid at room temperature.

18. A method as claimed in claim 17, wherein the substrate is a YSZ substrate and the chemical etching is conducted using 20–50 percent aqueous solution of hydrofluoric acid.

19. A method as claimed in claim 17, wherein the substrate is a $SrTiO_3$ substrate and the chemical etching is conducted using 10–30 percent aqueous solution of hydrofluoric acid.

20. A method as claimed in claim 9, wherein the chemical etching is conducted using phosphoric acid at a temperature ranging from 100°–150° C.

21. A method as claimed in claim 20, wherein the substrate is a MgO single crystal substrate and the chemical etching is conducted using concentrated phosphoric acid.

22. A method as claimed in claim 20, wherein the substrate is a $SrTiO_3$ single crystal substrate and the chemical etching is conducted using concentrated phosphoric acid.

23. A method as claimed in claim 20, wherein the substrate is a $LaAlO_3$ single crystal substrate and the chemical etching is conducted using concentrated phosphoric acid.

24. A method as claimed in claim 9, wherein the chemical etching is conducted using a solution of sodium hydroxide at a temperature in range of from 50° to 130° C.

25. A method as claimed in claim 24, wherein the substrate is a $SrTiO_3$ single crystal substrate and the chemical etching is conducted using a concentrated solution of sodium hydroxide at a temperature in the range of from 80° to 130° C.

26. A method as claimed in claim 24, wherein the substrate is a $NdGaO_3$ single crystal substrate and the chemical etching is conducted using a concentrated solution of sodium hydroxide at a temperature in the range of from 80° to 130° C.

27. A method as claimed in claim 24, wherein the substrate is a $LaAlO_3$ single crystal substrate and the chemical etching is conducted using concentrated solution of sodium hydroxide at a temperature in a range of from 50° to 110° C.

28. A method as claimed in claim 9, wherein the chemical etching is conducted using a mixture of nitric acid and hydrofluoric acid at room temperature.

29. A method as claimed in claim 28, wherein the substrate is a MgO single crystal substrate and the chemical etching is conducted using a mixture of nitric acid and hydrofluoric acid including 2 parts of nitric acid, 2 parts of hydrofluoric acid an 1 part of water by volume.

30. A method as claimed in claim 28, wherein the substrate is a YSZ substrate and the chemical etching is conducted using a mixture of nitric acid and hydrofluoric acid including 4 parts of nitric acid, 3 parts of hydrofluoric acid and 1 part of water by volume.

31. A method as claimed in claim 28, wherein the substrate is a $SrTiO_3$ substrate the chemical etching is conducted using a mixture of nitric acid and hydrofluoric acid including 3 parts of nitric acid, 3 parts of hydrofluoric acid and 1 part of water by volume.

32. A method as claimed in claim 28, wherein the substrate is a $NdGaO_3$ substrate and the chemical etching is conducted using a mixture of nitric acid and hydrofluoric acid including 2 parts of nitric acid, 2 parts of hydrofluoric acid and 1 part of water by volume.

33. A method as claimed in claim 28, wherein the substrate is a $LaAlO_3$ substrate and the chemical etching is conducted using a mixture of nitric acid and hydrofluoric acid including 3 parts of nitric acid, 3 parts of hydrofluoric acid and 1 part of water by volume.

* * * * *

UNITED STATES PATENT AND TRADEMARK OFFICE
CERTIFICATE OF CORRECTION

PATENT NO. : 5,560,836  Page 1 of 3
DATED : October 1, 1996
INVENTOR(S) : NAGAISHI It is certified that error appears in the above-indentified patent and that said Letters Patent is hereby corrected as shown below:

Col. 11, Line 55 (Claim 3, Line 4) "of said and" should be --of said substrate and--;

Col. 11, Line 66 (Claim 6, Line 6) "to a" should be --to remove a--;

Col. 12, Line 5 (Claim 8, Line 3) "...of a..." should be --of etching a--;

Col. 12, Line 17 (Claim 10, Line 4) "...aqueous..." should be --percent aqueous--;

Col. 12, Line 18 (Claim 10, Line 5) "acid hydrofluoric" should be --acid and hydrofluoric--;

Col. 12, Line 19 (Claim 11, Line 1) "wherein substrate" should be --wherein the substrate--;

Col. 12, Line 24 (Claim 11, Line 6) "acid 1" should be --acid and 1--;

Col. 12, Line 27 (Claim 12, Line 1) "wherein substrate" should be --wherein the substrate--;

Col. 12, Line 31 (Claim 12, Line 5) "nitric acid 2" should be --nitric acid, 2--;

UNITED STATES PATENT AND TRADEMARK OFFICE
CERTIFICATE OF CORRECTION

PATENT NO.   :   5,560,836
DATED        :   October 1, 1996
INVENTOR(S)  :   NAGAISHI It is certified that error appears in the above-indentified patent and that said Letters Patent is hereby corrected as shown below:

Col. 12, Line 33 (Claim 13, Line 1) "wherein substrate" should be --wherein the substrate--;

Col. 12, Line 34 (Claim 13, Line 2) "is d by" should be --is conducted by--;

Col. 12, Line 40 (Claim 14, Line 1) after "method as" insert --claimed in--;

Col. 12, Line 40 (Claim 14, Line 1) "...6 the..." should be --6, comprising the--;

Col. 12, Line 42 (Claim 14, Line 3) "aid" should be --said--;

Col. 12, Line 52 (Claim 17, Line 1) after "claimed" insert --in--;

Col. 12, Line 59 (Claim 19, Line 1) after "claimed" insert --in--;

Col. 13, Line 9 (Claim 24, Line 3) after "temperature in" insert --the--;

UNITED STATES PATENT AND TRADEMARK OFFICE
CERTIFICATE OF CORRECTION

PATENT NO. :     5,560,836
DATED      :     October 1, 1996
INVENTOR(S):     NAGAISHI It is certified that error appears in the above-indentified patent and that said Letters Patent is hereby corrected as shown below:

Col. 14, Line 4 (Claim 29, Line 5) "an" should be --and--;

Col. 14, Line 11 (Claim 31, Line 2) after "substrate" insert --and--.

Signed and Sealed this

First Day of April, 1997

Attest:

BRUCE LEHMAN

Attesting Officer    Commissioner of Patents and Trademarks